(12) United States Patent
Lian et al.

(10) Patent No.: US 11,348,763 B2
(45) Date of Patent: May 31, 2022

(54) CORROSION-RESISTANT STRUCTURE FOR A GAS DELIVERY SYSTEM IN A PLASMA PROCESSING APPARATUS

(71) Applicant: ADVANCED MICRO-FABRICATION EQUIPMENT INC. CHINA, Shanghai (CN)

(72) Inventors: Zengdi Lian, Shanghai (CN); Rason Zuo, Shanghai (CN); Dee Wu, Shanghai (CN); Yu Guan, Shanghai (CN); Xingjian Chen, Shanghai (CN); Shenjian Liu, Shanghai (CN); Tuqiang Ni, Shanghai (CN)

(73) Assignee: ADVANCED MICRO-FABRICATION EQUIPMENT INC. CHINA, Shanghai (CN)

( * ) Notice: Subject to any disclaimer, the term of this patent is extended or adjusted under 35 U.S.C. 154(b) by 0 days.

(21) Appl. No.: 16/885,632

(22) Filed: May 28, 2020

(65) Prior Publication Data
US 2020/0381213 A1 Dec. 3, 2020

(30) Foreign Application Priority Data
May 31, 2019 (CN) .......................... 201910466981.1

(51) Int. Cl.
*H01J 37/32* (2006.01)
*H01L 21/67* (2006.01)

(52) U.S. Cl.
CPC ....... *H01J 37/3244* (2013.01); *H01J 37/3211* (2013.01); *H01J 37/32477* (2013.01); *H01J 2237/334* (2013.01); *H01L 21/67069* (2013.01)

(58) Field of Classification Search
CPC .. H01J 37/324; H01J 37/321; H01J 37/32477; H01J 2237/334; H01L 21/67069
See application file for complete search history.

(56) References Cited

U.S. PATENT DOCUMENTS

| | | | | |
|---|---|---|---|---|
| 6,013,155 A | * | 1/2000 | McMillin | C23C 16/455 118/723 I |
| 2005/0150866 A1 | * | 7/2005 | O'Donnell | C23C 16/4404 216/67 |

(Continued)

*Primary Examiner* — Yuechuan Yu
(74) *Attorney, Agent, or Firm* — Womble Bond Dickinson (US) LLP; Joseph Bach, Esq.

(57) ABSTRACT

Disclosed is a corrosion-resistant structure for a gas delivery system in a plasma processing apparatus. By providing a plating layer of corrosion-resistant material at the parts including the gas channel to avoid reacting with the delivered corrosive gas, metal and particle contaminations are reduced. By reversely mounting nozzles such that they reliably cover the plating layer inside the gas outlet holes, the disclosure prevents the corrosion-resistant material from being damaged by the plasma generated inside the cavity. By forming a corrosion-resistant yttrium oxide coating at the surfaces of the nozzles exposed to the cavity, the disclosure prevents the plasma from eroding the nozzles. The disclosure further leverages a flexible corrosion-resistant material, such as Teflon, to the sealing surfaces of the liner in contact with the dielectric window and the cavity, which improves the overall sealing effect of the liner. The disclosure may effectively enhance the corrosion-resistant and sealing properties of the liner and prolong its service life, as well as improving operating stability of the plasma processing apparatus.

9 Claims, 4 Drawing Sheets

(56) References Cited

U.S. PATENT DOCUMENTS

| | | | | |
|---|---|---|---|---|
| 2005/0218003 A1* | 10/2005 | Wang | .................. | H01L 21/6838 |
| | | | | 205/157 |
| 2015/0371831 A1* | 12/2015 | Rozenzon | ......... | C23C 16/45578 |
| | | | | 239/548 |
| 2017/0365444 A1* | 12/2017 | Kim | .................. | H01J 37/32458 |

* cited by examiner

CORROSION-RESISTANT STRUCTURE FOR A GAS DELIVERY SYSTEM IN A PLASMA PROCESSING APPARATUS

RELATED APPLICATION

The present application claims priority to and the benefit of Chinese Patent Application No. 201910466981.1, filed on 31 May 2019, and the disclosure of which is hereby incorporated by reference in its entirety.

FIELD

Embodiments of the present disclosure relate to a plasma processing apparatus, and more particularly relate to a corrosion-resistant structure for a gas delivery system in a plasma processing apparatus.

BACKGROUND

As shown in FIG. 1, in an existing inductively coupled plasma (ICP) processing apparatus, RF (Radio Frequency) power loaded onto an inductively coupled coil 500 is coupled into a chamber 100 via a dielectric window 400; a process gas, which is supplied to the chamber 100 via a gas delivery system, is ionized to form plasma, thereby processing a wafer 700 disposed on an electrostatic chuck 600.

The process gas outputted from a gas box is split, by a splitter, into two inlet gas paths: a middle inlet gas path and an edge inlet gas path, wherein the middle inlet gas path is supplied to the chamber 100 via a gas-inlet device mounted at the dielectric window 400; while the edge inlet gas path is supplied into the gas channel 210 of the liner 200 and is then transversely delivered into the chamber 100 via a plurality of nozzles 300 which are mounted, in a distributive fashion, in the inner wall of the liner 200. The liner 200 is disposed on a cavity of the chamber 100 to support edges of the dielectric window 400. The liner 200 is grounded by contacting the cavity. A baffle plate extending downward from the inner wall of the body of the liner 200 is arranged surrounding the inner side of the cavity of the chamber 100, wherein the baffle plate plays a role of restraining the plasma from eroding the cavity wall and other parts.

However, the liner 200 is made of anodized aluminum alloy, which needs to be heated to about 120° C. during use; so, if what is delivered is a corrosive gas, particularly a strong oxidizing gas and a strong acid gas, it will directly chemically react with the base material of the liner 200, very easily causing corrosion to the gas channel 210, resulting in metal and particle contaminations. For example, $AlCl_3$, which is generated by the delivered $Cl_2$ corroding the gas channel 210 and enters the chamber 100, will be deposited in the cavity, causing contamination to a surface of the electrostatic chuck 600 or wafer 700, further affecting the final etching precision and yield. The corrosion issue also requires frequent replacement of the liner 200 during long-term use, incurring a very high cost.

FIG. 2 shows a conventional nozzle insertion structure, wherein a nozzle 300 includes a limit segment with a larger outer diameter and an inserted segment with a smaller outer diameter; inside the nozzle 300 is a gas-delivering pipeline through the limit segment and the inserted segment. The nozzle 300 is inserted into the inner wall of the liner 200 from the side where the gas channel 210 is disposed, i.e., the inserted segment of the nozzle 300 penetrates through a gas-outlet hole in the inner wall of the liner 200 such that the distal end of the inserted segment is located at the side where the cavity is located, and the end face of the distal end of the inserted segment may be in flush with the inner surface of the liner at the same side; the outer diameter of the limit segment of the nozzle 300 is greater than the aperture of the gas-outlet hole, allowing the limit segment to be retained inside the gas channel 210. However, such a structure cannot prevent the plasma, which is generated in the chamber 100 but seeps through an assembly gap between the nozzle 300 and the gas-outlet hole, from eroding the gas-outlet hole, the gas channel 210 and other parts.

SUMMARY

The present disclosure provides a corrosion-resistant structure for a gas delivery system in a plasma processing apparatus; by providing a plating layer of corrosion-resistant material respectively at liner parts and sealing surface of the liner through which the gas flows, metal and particle contamination issues during the gas delivery process are effectively solved and the overall sealing effect of the liner is enhanced; by reversely mounting nozzles at gas-outlet holes, the plasma is effectively prevented from damaging the corrosion-resistant material.

To achieve the objective above, one of the technical solutions of the present disclosure is to provide a corrosion-resistant structure for a gas delivery system, the gas delivery system comprising a liner, a plurality of gas-inlet holes being provided in an outer wall of the liner, and a gas channel in communication with the gas-inlet holes being arranged surrounding the inside of the liner, a plurality of gas-outlet holes in communication with the gas channel being further provided, in a distributive fashion, in the inner wall of the liner; nozzles being correspondingly mounted on respective gas-outlet holes, such that a process gas is delivered from the gas-inlet holes of the liner and then delivered into a chamber via the nozzles at the gas-outlet holes; wherein:

a plating layer of corrosion-resistant material is provided for the gas channel, the gas-inlet holes, and the gas-outlet holes of the liner, respectively;

the nozzle includes a limit segment with a larger outer diameter and an inserted segment with a smaller outer diameter, a process gas-delivering pipeline through the limit segment and the inserted segment being provided inside the nozzle;

wherein the inserted segment of the nozzle passes through the corresponding gas-outlet hole of the liner, a distal end of the inserted segment being disposed inside the gas channel; the limit segment of the nozzle stays at an inner surface side of the liner, the inner surface of the liner being disposed inside a cavity of the chamber.

Optionally, the gas-outlet holes of the liner are sink holes, the gas-outlet holes having a larger opening at the cavity side and a smaller opening at the opposite side of the gas channel; the limit segment of the nozzle is disposed at the opening of the corresponding gas-outlet hole at the cavity side.

Optionally, the gas-outlet holes of the liner are through holes with a same caliber at both ends, and the limit segment of the nozzle shields the opening of the corresponding gas-outlet hole at the cavity side and the inner surface of the liner around the corresponding gas-outlet hole.

Optionally, the distal end of the inserted segment of the nozzle is disposed in the gas channel, a recessed groove is provided at the perimeter of the distal end, and a clamp is provided surrounding the recessed groove, wherein the clamp is tightly attached to the surface of the inner wall of the liner at the gas channel side to clamp the recessed groove, thereby fixing the position of the nozzle.

Optionally, the nozzle is provided with a first sealing groove on the surface of the inserted segment inside the corresponding gas-outlet hole, the first sealing groove being sleeved with at least one sealing ring.

Optionally, the liner is supported by the cavity of the chamber below the liner, and the liner supports the edges of the dielectric window above; the body of the liner extending downward from the inner wall is provided with a barrel-shaped baffle plate, the baffle plate being provided surrounding the inner side of the cavity of the chamber;

the plating layer of corrosion-resistant material is formed at sealing surfaces of the liner in contact with the cavity of the chamber and the dielectric window; the sealing surfaces include a plurality of sealing grooves at the top of the liner in contact with the dielectric window, at least part of the top face position of the liner in contact with the dielectric window, at least part of the bottom face position of the liner in contact with the cavity, and at least part of the bottom surface and outer side of the corner between the body of the liner and the baffle plate.

Optionally, the liner is made of anodized aluminum alloy.

Optionally, the plating layer of corrosion-resistant material is a Teflon plating layer.

Optionally, the surface of the limit segment of the nozzle exposed to the cavity side is formed with an yttrium oxide coating.

Optionally, the inner surface of the liner exposed to the cavity is formed with an yttrium oxide coating.

Another technical solution of the present disclosure is to provide a plasma processing apparatus that leverages any corrosion-resistant structure for a gas delivery system as described above;

the plasma processing apparatus comprises a chamber; a liner is provided on a cavity of the chamber, the liner supporting edges of a dielectric window above the liner; an inductively coupled coil on the dielectric window is loaded with a RF power, the RF power being coupled into the chamber via the dielectric window; a process gas, which is introduced into the chamber via a gas delivery system, is ionized to form plasma, thereby processing a wafer disposed on an electrostatic chuck at the bottom of the chamber;

the process gas enters a gas channel provided surrounding the inside of the liner via a plurality of gas-inlet holes disposed in the outer wall of the liner and is delivered into the chamber via nozzles mounted corresponding to a plurality of gas-outlet holes provided, in a distributive fashion, in the inner wall of the liner; a plating layer of corrosion-resistant material is provided for the gas channel, the gas-inlet holes, and the gas-outlet holes of the liner; respectively; each of the nozzles includes a limit segment with a larger outer diameter and an inserted segment with a smaller outer diameter; a process gas-delivering pipeline through the limit segment and the inserted segment is provided inside the each nozzle;

wherein the inserted segment of the nozzle passes through the corresponding gas-outlet hole of the liner, a distal end of the inserted segment being disposed in the gas channel; the limit segment of the nozzle stays at an inner surface side of the liner, the inner surface of the liner being disposed inside the cavity of the chamber.

Optionally, in the gas delivery system, a process gas outputted via a gas box is split, by a splitter, into two inlet gas paths: a middle inlet gas path and an edge inlet gas path, wherein the middle inlet gas path is delivered downward into the chamber via a gas-inlet device mounted at the dielectric window; and the edge inlet gas path is delivered transversely into the chamber via the gas-inlet holes, the gas channel, and the nozzles at the gas-outlet holes of the liner.

At the liner of a conventional plasma processing apparatus, the parts including the gas channel through which the gas passes are all anodized aluminum alloy, which easily react with the delivered corrosive gas such as $Cl_2$, causing metal and particle contaminations. In contrast, in the present disclosure, a plating layer of corrosion-resistant material is provided for the liner at the parts including the gas channel through which the gas passes, such that they are not easy to react with a corrosive gas such as $Cl_2$, thereby reducing metal and particle contaminations caused by corrosion to the electrostatic chuck or the wafer.

In addition, to prevent the plasma generated in the cavity from damaging the corrosion-resistant material, the nozzles in the present disclosure are reversely mounted, such that they reliably shield the plating layer in the gas-outlet holes; in this way, the gas channel is not only hard to react with the delivered corrosive gas, but also will not be damaged by the plasma. In the present disclosure, $Y_2O_3$ is plated on the surface of the nozzles exposed to the cavity side, thereby blocking the plasma from eroding the nozzles.

A flexible Teflon material is also applied to the sealing surface of the liner in contact with the dielectric window and the cavity, which enhances the overall sealing effect of the liner.

The present disclosure utilizes plating layers such as Teflon and reversely mounted nozzles to effectively protect the liner, which eliminates the need to replace hardware, but still may effectively enhance the corrosion-resistant and sealing properties of the liner and prolong its service life. The present disclosure overcomes the metal and particle contaminations caused to the liner during use process and improves operating stability of the etching machine set.

DETAILED DESCRIPTION OF EMBODIMENTS

Hereinafter, preferred embodiments of the present disclosure will be described in further detail with reference to the accompanying drawings.

Figure 3:
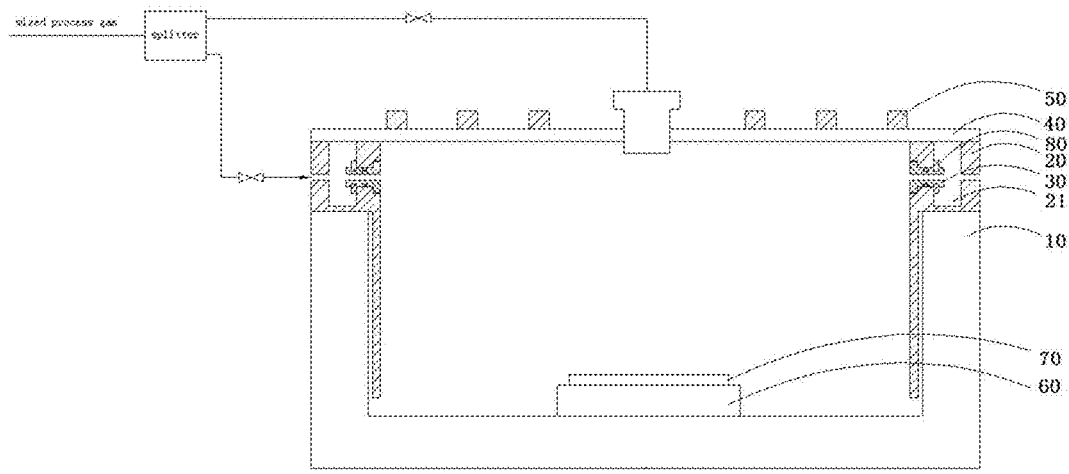
FIG. 3 is a schematic diagram of a plasma processing apparatus according to the present disclosure.

As shown in FIG. 3, in an inductively coupled plasma (ICP) processing apparatus according to the present disclosure, the RF power loaded onto an inductively coupled coil 50 is coupled into a chamber 10 via an dielectric window 40 so as to ionize a process gas supplied to the chamber 10 via a gas delivery system to form plasma, thereby performing etching and other processing to a wafer 70 disposed on the electrostatic chuck 60. A liner 20 is disposed on a cavity of the chamber 10 to supporting edges of the dielectric window

40. The liner 20 is grounded by contacting the cavity. A barrel-shaped baffle plate extending downward from the inner wall of the liner 20 is arranged surrounding the inner side of the cavity, wherein the baffle plate plays a role of restraining the plasma and protecting the parts including the cavity. An opening is provided on the barrel-shaped baffle plate, for the wafer to pass through before and after being processed.

In the gas delivery system, a process gas outputted from a gas box is split, by a splitter, into a middle inlet gas path and an edge inlet gas path, wherein the middle inlet gas path is supplied to the chamber 10 via a gas-inlet device mounted at the dielectric window 40, and the edge inlet gas path enters the gas channel 21 surrounding the inside of the liner 20 via gas-inlet holes penetrating through the outer wall of the liner 21; a plurality of gas-outlet holes through the inner wall of the liner are further provided in a distributive fashion, each gas-outlet hole being communicative with the gas channel 21 and correspondingly having a nozzle 30 inserted, thereby delivering the gas into the chamber 10.

The liner 20 is made of anodized aluminum alloy; a plating layer of corrosion-resistant material is further provided at a plurality of parts including the gas channel 21, the gas-inlet holes and the gas-outlet holes so as to prevent the process gas delivered by the liner 20 from corroding those parts. As an example, a material corrosion-resistant against halogen gas, such as Teflon, is plated at parts including the gas channel 21, such that those parts will not be corroded by the delivered gases such as $BCl_3$ and $Cl_2$.

Figure 1:
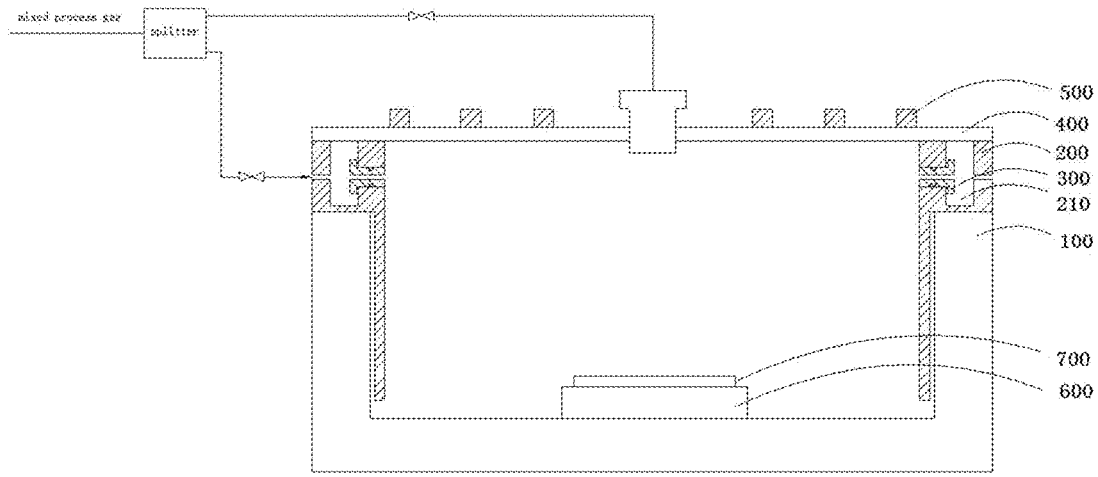
FIG. 1 is a schematic diagram of a conventional plasma processing apparatus.
Figure 2:
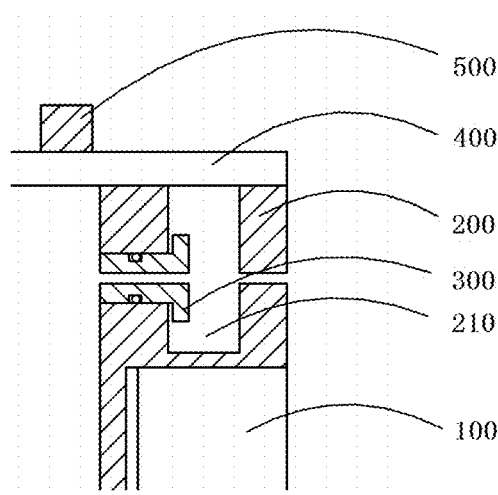
FIG. 2 is an enlarged view of the liner in FIG. 1.
Figure 4:
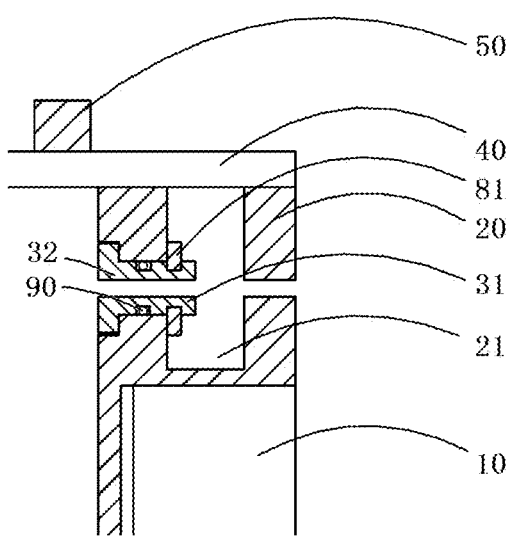
FIG. 4 is an enlarged view of the liner in FIG. 3.
Figure 5:
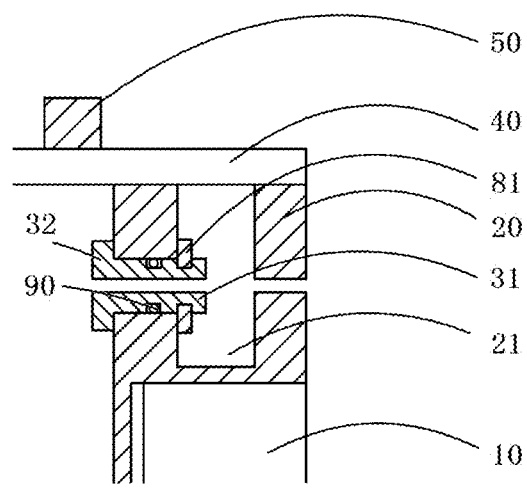
FIGS. 5 and 6 are enlarged views of two implementation structures at the liner.
Figure 6:
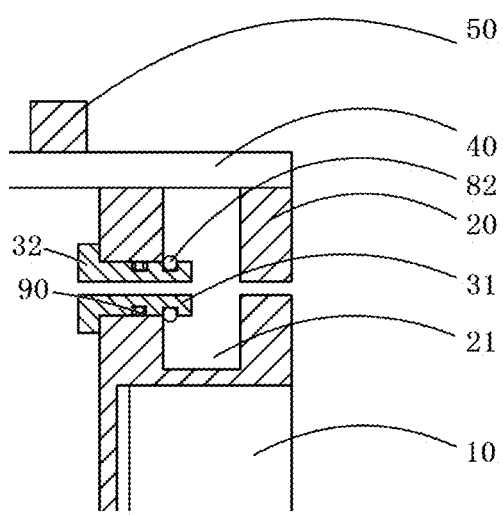

The nozzle 30 includes a limit segment 32 with a larger outer diameter and an inserted segment 31 with a smaller outer diameter, a pipeline through the limit segment 32 and the inserted segment 31 being provided inside the nozzle 30 to deliver the process gas. Compared with the conventional nozzles 300 shown in FIG. 2, the nozzles 30 in the present disclosure are all reversely mounted. As shown in FIGS. 4-6, they are inserted into the gas channel 21 from the inner surface side exposed to the cavity, wherein the inserted segment 31 of the nozzle 30 penetrates through the corresponding gas-outlet hole in the inner wall, causing the distal end of the inserted segment 31 to be disposed in the gas channel 21; the outer diameter of the limit segment 32 of the nozzle 30 is greater than the aperture of the corresponding gas-outlet hole so as to retain the limit segment 32 at the inner surface side of the liner 20. The nozzles 30 reversely inserted into the gas-outlet holes in the present disclosure may completely shield the plating layer of corrosion-resistant material inside the gas-outlet holes so as to effectively prevent damages to the plating layer due to leakage of the plasma generated in the chamber 10, thereby preventing parts such as the gas-outlet holes and the gas channel 21 from being eroded by the plasma.

In the embodiment shown in FIG. 4, the gas-outlet holes in the inner wall of the liner 20 are sink holes exposed to the cavity side, i.e., their openings corresponding to the inner surface of the liner 20 are relatively large, such that the limit segments 32 of the nozzles 30 are exactly disposed in the openings at the inner surface side. Further, the distal end of the inserted segment 31 of each of the nozzles 30 is disposed within the gas channel 21, and a clamp 81 is provided surrounding the recessed groove at the perimeter of the distal end, wherein the clamp 81 is tightly attached to the surface of the inner wall of the liner 20 at the gas channel 21 side to clamp the recessed groove, thereby fixing the position of the nozzle 30. The nozzle 30 is further provided with a sealing groove on the surface of the inserted segment 31 corresponding to the inside of the gas-outlet hole, the sealing groove being sleeved with at least one sealing ring 90 to enhance the sealing effect.

Figure 7:
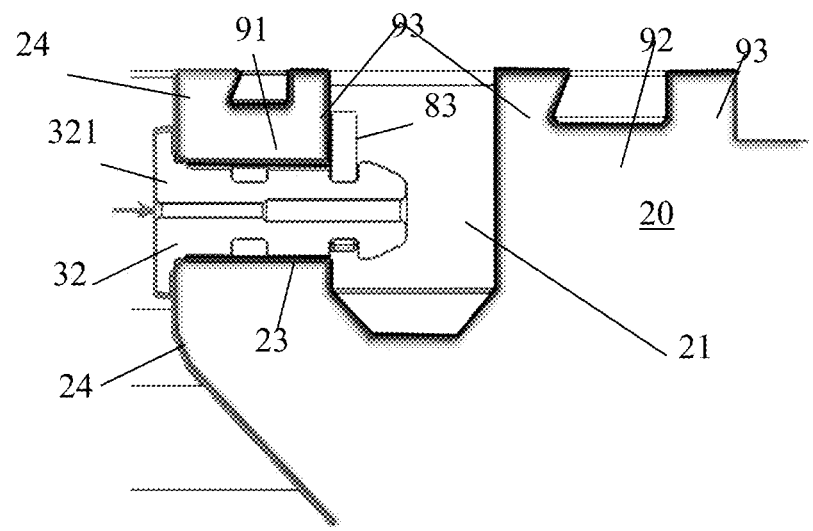
FIG. 7 is a schematic diagram of the positions of plating layers and the positions of coating layers around the gas-outlet holes of the liner according to the present disclosure.

Different from the structure where the limit segment 32 of the nozzle 30 is embedded in the gas-outlet hole as shown in FIG. 4, in the embodiments shown in FIGS. 5, 6, and 7, the gas-outlet holes in the inner wall of the liner 20 are through holes with substantially consistent calibers at both ends, wherein the limit segments 32 of the nozzles 30 shield the openings of the gas-outlet holes at the cavity side, such that the limit segments 32 are in direct contact with the inner surface of the liner around the gas-outlet holes. The shape of the clamp 80 is not limited. As shown in FIG. 5, the clamp may be of a ring-shape or plate-shape with a rectangular section; in FIG. 6, the clamp 82 may be of a sphere shape with a round section; in FIG. 7, the clamp 83 is for example a clip, the two parts of which correspondingly clamping the upper portion and the lower portion of the recessed grooves of the nozzles 30 are different in sizes, wherein it is allowed that only the part corresponding to the upper (or lower) portion of the recessed groove is tightly attached to the inner wall of the liner 20 at the side of the gas channel 21.

Figure 8:
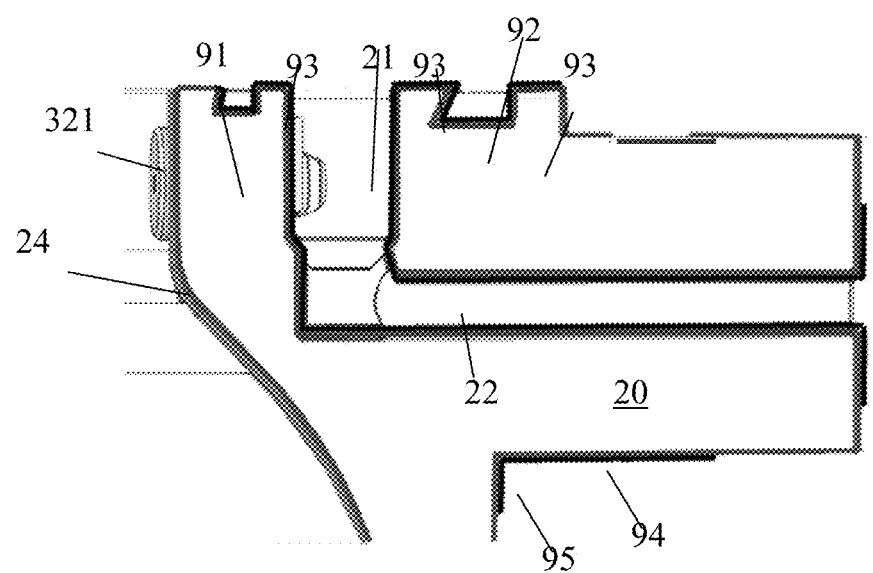
FIG. 8 is a schematic diagram of the coating layer position and the coating position nearby the gas-inlet holes of the liner according to the present disclosure.

As shown in FIGS. 7 and 8, in the present disclosure, a plating layer of Teflon or other corrosion-resistant material is provided at a plurality of parts including the gas channel 21, the gas-inlet holes 21, and the gas-outlet holes 23 in the liner 20. During operation of the equipment, as the Teflon plating layer at these parts has a superb chemical inertness, surface non-adhesiveness, and gas infiltration resistance, the gas flowing through the liner 20 may be isolated from the base material of the liner 20, without causing metal and particle contaminations. Particularly, the gas-inlet holes 22 and the gas-outlet holes 23 of the liner 20 have a very small inner diameters, e.g., about 7 mm; if the spray coating applied to the parts including the gas channel 21 cannot effectively shield the inside of the holes, a flow perfusion process (allowing a corrosion-resistant liquid to flow through) may be preferably used to coat the inside of the gas-inlet holes 22 and the gas-outlet holes 23 to form a plating layer.

In the present disclosure, a plating layer of Teflon or other corrosion-resistant material is further formed at a plurality of sealing surfaces of the liner 20. The sealing surfaces include a plurality of sealing grooves 91, 92 at the top of the liner 20 in contact with the dielectric window 40, a position 93 on the top surface of the liner 20 partially in contact with the dielectric window 40, a position 94 in contact with the cavity at the bottom surface of the liner 20, and the outer side surface 95 at the corner between the body of the liner 20 and the baffle plate, etc. As Teflon has a relatively high compression rate and a relatively low surface roughness, provision of such a plating layer may further reduce the leak rate of the liner 20. Meanwhile, as Teflon has a superb property of withstanding high and low temperatures and its use temperature may range between −200° C. and 260° C. while still maintaining a superb performance, such a plating layer is very suitable for protecting the liner 20.

The present disclosure may further form a yttrium oxide ($Y_2O_3$) coating respectively at the surface 321 of the limit segment 32 of the nozzle 30 exposed to the inside of the cavity, and the position 24 on the inner surface of the liner 20 exposed to the inside of the cavity (optionally, the position on the inner surface of the liner 20 covered by the limit segment 32 of the nozzle 30, etc.) so as to enhance the plasma corrosion resistant performance and prolong the service life of such parts.

Although the contents of the present disclosure have been described in detail through the foregoing preferred embodiments, it should be understood that the depictions above shall not be regarded as limitations to the present disclosure. After those skilled in the art having read the contents above, many modifications and substitutions to the present disclosure are all obvious. Therefore, the protection scope of the present disclosure should be limited by the appended claims.

We claim:

1. A corrosion-resistant structure for a gas delivery system, the gas delivery system comprising a liner, the liner comprising a first portion supported by a cavity of a chamber below the liner, the first portion supporting a dielectric window above the liner, and a second portion extending from the first portion downwardly, the second portion being a barrel-shaped baffle plate, the baffle plate being provided surrounding an inner side of the cavity of the chamber; a plurality of gas-inlet holes being provided in an outer wall of the first portion of the liner, and a gas channel in communication with the gas-inlet holes being arranged surrounding an inside of the first portion of the liner, a plurality of gas-outlet holes in communication with the gas channel being further provided, in a distributive fashion, in an inner wall of the first portion of the liner; nozzles being correspondingly mounted on respective gas-outlet holes, such that a process gas is delivered from the gas-inlet holes of the liner and then delivered into the cavity of the chamber via the nozzles at the gas-outlet holes; wherein:
a plating layer of gas corrosion-resistant material is provided for the gas channel, the gas-inlet holes, and the gas-outlet holes of the liner, respectively;
the nozzle includes a limit segment with a larger outer diameter and an inserted segment with a smaller outer diameter, a process gas-delivering pipeline through the limit segment and the inserted segment being provided inside the nozzle;
the inserted segment of the nozzle passes through the corresponding gas-outlet hole of the liner, a distal end of the inserted segment being disposed inside the gas channel; the limit segment of the nozzle stays at an inner surface of the inner wall of the first portion of the liner, the inner surface of the inner wall of the first portion of the liner being disposed inside the cavity of the chamber;
the surface of the limit segment of the nozzle exposed to the cavity is formed with an yttrium oxide coating; and
an inner surface of the inner wall of the liner exposed to the cavity is formed with an yttrium oxide coating.

2. The corrosion-resistant structure for a gas delivery system according to claim 1, wherein the gas-outlet holes of the liner are sink holes, the gas-outlet holes having a larger opening at cavity side and a smaller opening at an opposite side of the gas channel; the limit segment of the nozzle is disposed at the opening of the corresponding gas-outlet hole at the cavity side.

3. The corrosion-resistant structure for a gas delivery system according to claim 1, wherein the gas-outlet holes of the liner are through holes with a same caliber at both ends, and the limit segment of the nozzle shields the opening of the corresponding gas-outlet hole at the inner surface of the inner wall of the first portion of the liner around the corresponding gas-outlet hole.

4. The corrosion-resistant structure for a gas delivery system according to claim 1, wherein the distal end of the inserted segment of the nozzle is disposed in the gas channel, a recessed groove is provided at the perimeter of the distal end, and a clamp is provided surrounding the recessed groove, wherein the clamp is tightly attached to the surface of the inner wall of the first portion of the liner at the gas channel side to clamp the recessed groove, thereby fixing the position of the nozzle.

5. The corrosion-resistant structure for a gas delivery system according to claim 1, wherein the nozzle is provided with a first sealing groove on the surface of the inserted segment inside the corresponding gas-outlet hole, the first sealing groove being sleeved with at least one sealing ring.

6. The corrosion-resistant structure for a gas delivery system according to claim 1, wherein
the plating layer of corrosion-resistant material is formed at sealing surfaces of the liner in contact with the cavity of a chamber below the liner and the dielectric window; the sealing surfaces include a plurality of sealing grooves at a top of the liner in contact with the dielectric window, at least part of the top of the liner in contact with the dielectric window, at least part of a bottom face position of the liner in contact with the cavity.

7. The corrosion-resistant structure for a gas delivery system according to claim 1, wherein:
the liner is made of anodized aluminum alloy; and
the plating layer of gas corrosion-resistant material is a Teflon plating layer.

8. A plasma processing apparatus comprising the corrosion-resistant structure according to any one of claims 1~7, wherein the liner is provided on the cavity of the chamber, the liner supports edges of the dielectric window above the liner; an inductively coupled coil is provided on the dielectric window and is loaded with a RF power, the RF power being coupled into the chamber via the dielectric window; a process gas, which is introduced into the chamber via the gas delivery system, is ionized to form plasma, thereby processing a wafer disposed on an electrostatic chuck at the bottom of the chamber; the process gas enters the gas channel via the plurality of gas-inlet holes and is delivered into the chamber via the nozzles mounted corresponding to the plurality of gas-outlet holes; the plating layer of gas corrosion-resistant Teflon material is provided for the gas channel, the gas-inlet holes, and the gas-outlet holes of the liner, respectively; each of the nozzles includes the limit segment with a larger outer diameter and the inserted segment with a smaller outer diameter; a process gas-delivering pipeline through the limit segment and the inserted segment is provided inside the each nozzle; and the inserted segment of the nozzle passes through the corresponding gas-outlet hole of the liner, a distal end of the inserted segment being disposed in the gas channel; the limit segment of the nozzle stays at the inner surface of the inner wall of the first portion of the liner, the inner surface of the inner wall of the first portion of the liner being disposed inside the cavity of the chamber.

9. The plasma processing apparatus according to claim 8, wherein:
in the gas delivery system, a process gas outputted via a gas box is split, by a splitter, into two inlet gas paths: a middle inlet gas path and an edge inlet gas path, wherein the middle inlet gas path is delivered downward into the chamber via a gas-inlet device mounted at the dielectric window; and the edge inlet gas path is delivered transversely into the chamber via the gas-inlet holes, the gas channel, and the nozzles at the gas-outlet holes of the first portion of the liner.

* * * * *